(12) United States Patent
Jain et al.

(10) Patent No.: US 6,797,412 B1
(45) Date of Patent: Sep. 28, 2004

(54) FULL COLOR DISPLAY STRUCTURES USING PSEUDOMORPHIC CLADDED QUANTUM DOT NANOPHOSPHOR THIN FILMS

(75) Inventors: Faquir C. Jain, Storrs, CT (US); Fotios Papadimitrakopoulos, Coventry, CT (US)

(73) Assignee: University of Connecticut, Storrs, CT (US)

( * ) Notice: Subject to any disclaimer, the term of this patent is extended or adjusted under 35 U.S.C. 154(b) by 0 days.

(21) Appl. No.: 09/547,415

(22) Filed: Apr. 11, 2000

(51) Int. Cl.[7] .............................................. H05B 33/00
(52) U.S. Cl. ....................... 428/690; 428/917; 313/498; 257/103
(58) Field of Search ................................ 428/690, 917; 252/584, 301.6; 257/102, 103, 88, 89, 96; 313/498

(56) References Cited

U.S. PATENT DOCUMENTS

| | | | |
|---|---|---|---|
| 5,274,269 A | * 12/1993 | DePuydt et al. | ............ 257/744 |
| 5,396,103 A | * 3/1995 | Oiu et al. | .................... 257/744 |
| 5,943,355 A | * 8/1999 | Sanaka et al. | ................. 372/45 |
| 6,147,365 A | * 11/2000 | Fischer et al. | ................. 257/78 |
| 6,157,047 A | * 12/2000 | Fujita et al. | ................... 257/51 |
| 6,236,060 B1 | * 5/2001 | Chan et al. | .................... 257/13 |

* cited by examiner

*Primary Examiner*—Dawn Garrett
(74) *Attorney, Agent, or Firm*—H. C. Lin, Patent Agent

(57) ABSTRACT

This invention discloses novel device structures for fill color flat panel displays utilizing pseudomorphically cladded quantum dot nanocrystals. Different colors are obtained by changing the core size and composition of the quantum dots while maintaining a nearly defect-free lattice at the core-cladding interface. Light emission from the quantum dot core is obtained either by injection or by avalanche electroluminescence. A nanotip emitter device is also presented. These generic devices can be addressed using a variety of conventional display drivers, including active and passive matrix configuration.

1 Claim, 11 Drawing Sheets

FULL COLOR DISPLAY STRUCTURES USING PSEUDOMORPHIC CLADDED QUANTUM DOT NANOPHOSPHOR THIN FILMS

BACKGROUND OF THE INVENTION (1) Field of the Invention

This invention relates to color display devices, in particular to pseudomorphic cladded quantum dot nanophorphor thin film color display devices.

(2) Description of the Related Art

Cladded quantum dots have been extensively reported in the literature as a way of improving light emission intensity in quantum dots.[Ref.1,2] For example, cladded nanocrystals (CNCs) having CdSe core and ZnS cladding (or shell) have been used to produce high photoluminescence efficiency quantum dots.[Ref 3,4] These dots however, suffer from appreciable lattice mismatch between the core and cladding layer(s) that in turn contributes to a number of undesirable features such as:

i) Introduction of interfacial states responsible for photoluminescence (PL) and electroluminescence (EL) quenching.

ii) Limitation in growing thick cladding layers, as a result of lattice mismatch which becomes more pronounced in luminescence quenching as the cladding thickness increases. [Ref.4]

iii) The blinking behavior of these CNCs, closely related to exciton confinement in these nanoparticles, is greatly affected by defects such as that introduced by the lattice mismatch between core and cladding layer(s).[Ref.5]

Quantum dot devices require incorporation of dots in thin film forms that can be used for electronic excitation. The size distribution, composition variation and non-periodic placement of these quantum dots greatly affect the emitted wavelength, and overall device performance, especially for lasing.[Ref.6] Growth of quantum dots by self-organization has been reported to demonstrate lasing.[Ref.7] However, these devices do not yield the expected improvement in the threshold current density predicted for quantum dot lasers.

Liquid phase (solution) grown nanocrystals possess certain limitations in creating core-shell architectures with improved lattice-matching.[Ref.8] Although the lattice mismatch of ZnS cladding is significant to that of the CdSe core, these CNCs emit brighter than their uncladded counterparts. [Ref.2] Cladding with CdS produces less strained lattices. This in turns makes the CdSe/CdS core/shell CNCs to photoluminescence brighter than the CdSe/ZnS CNCs. Restricting the cladding layer thickness to only few monolayers provides one way to reduce the interfacial defects (via strained layers). Once the thickness of the cladding is increased, the photoluminescence quantum efficiency of these CNCs plummets as a result of strain-induced defects, which become dominant. Therefore, the present state of the art is based on thinly cladded CNC nanocrystals. These CNCs are further coated with surface passivation organic surfactant layers, which in turn play a major role to the photoluminescence efficiency of these nanocrystals. Nanocrystals prepared this way, when incorporated in electroluminescent (EL) devices, utilizing carrier injection invariably yields poor EL efficiencies.

A layer of trioctyl phosphine oxide (TOPO) is presently one of the best surface passivating agent used in the liquid phase growth of these CNCs.[Ref.2,4] TOPO in conjunction with TOP (trioctyl phosphine) passivates both cationic ($Cd^{2+}$, $Zn^{2+}$, $Te^{2+}$, etc.) and anionic ($Se^{2-}$, $S^{2-}$, $O^{2-}$, etc.) surface species respectively. FIG. 1(a) shows a typical liquid phase grown cladded nanocrystal with a core (1) and a thin cladding (2). The outer cladding layer (3 comprises of both TOPO and TOP. FIG. 1(b) shows a single pixel EL structure utilizing these nanocrystals in the form of a thin layer (7) sandwiched between a hold transporting organic layer (6) and top metal electrode layer (8). The hole-transporting layer 6 is realized on a thin transparent ITO (indium tin oxide) electrode (layer 5), supported on a substrate (4). Poly (p-phenylenevinylene) along with other hole injecting organics has been used with limited success (Rdf.8).

Once the organic passivation agent(s) are partially removed or somehow degrade during device operation, the emission characteristics and brightness of these CNCs are significantly impaired. In addition, the natural inability of the organic phase towards dielectric breakdown poses a significant limitation for these CNCs to find application in field-assisted electroluminescent devices.

An alternate technology is the use of doped nanocrystals, DNCs, [Ref.9] where a dopant is introduced in the quantum dot, such as Mn in ZnS. These DNCs are incorporated in the form of thin films and used for electroluminescence or cathodoluminescence device applications.

Use of cladding layer material that has a higher band gap than the core with similar lattice constant results in a pseudomorphic cladded quantum dot. In this arrangement, the core-cladding lattice mismatch is accommodated as tensile or compressive strain. Having a small mismatch permits the growth of thicker cladding layers as has been shown in pseudomorphic strain layer quantum-wells. This improves the confinement of holes, electrons and excitons inside the core. In addition, these CNCs are less affected by the environment of the outer surface of the cladding layer, thus putting less stringent requirements on additional surface modifying layers. In particular, the known susceptibility of chalcogenides and other semiconducting materials to form oxides in the presence of atmospheric moisture and oxygen justifies the growth of compatible surface passivation layer(s) to further improve their environmental stability. Alternatively, one can use a compatible higher energy gap semiconducting layer before applying the outer passivation layer. Depending on the device structure, the outer layers could be semiconducting or conducting.

Quantum dots have been used to realize nanophosphor for a variety of display, lasers and luminescent-based diagnostic applications. The luminescent properties of these dots however, are strongly influenced by surface states. Cladding layers have been used to reduce these surface states, although the lattice mismatch in the materials for core and cladding creates undesirable quenching defects. In addition, the cladding layer prevents the injection of carriers, with the holes especially, hindered in reaching the core of these nanophosphors.

SUMMARY OF THE INVENTION

An object of this invention is to fabricate a high resolution color display device. Another object of this invention is to fabricate a display device using pseudomorphic cladded quantum dot nanophosphor thin film with high brightness.

This invention describes novel device structures for full color flat panel displays utilizing pseudomorphically cladded quantum dot nanocrystals. In this approach, different colors are obtained by changing the core size and/or composition of the quantum dots while maintaining a nearly defect-free lattice at the core-cladding interface. Light emission from the quantum dot core is obtained either by injection or by avalanche electroluminescence (EL).

Injection EL involves a novel approach injecting minority carriers in the core from the wide energy gap n and p-layers, through the cladding layer. In the case of inorganic-organic hybrid device structures, hole blocking layer surrounding the CNCs creates a favorable scenario for efficient injection and recombination taking place in the core of the cladded quantum dots. Avalanche EL device structures are proposed using single crystal, polycrystalline and amorphous starting surfaces. Device structures involving epitaxial layers and non-epitaxial growth are used. The ability to grow cladded nanocrystals (CNCs), pseudomorphically on single crystal substrates is also described. These, in conjunction with dielectric layers grown above and below the quantum dot layer(s), are expected to result in low voltage and high brightness CNC avalanche EL devices.

Variations of the disclosed structures are presented for various material systems. These generic EL devices can be addressed using a variety of conventional display drivers, including active and passive matrix configurations. In the case of avalanche/field emission EL, formation and use of nanotip structure is also presented.

DETAILED DESCRIPTION OF THE INVENTION

Figure 1A:
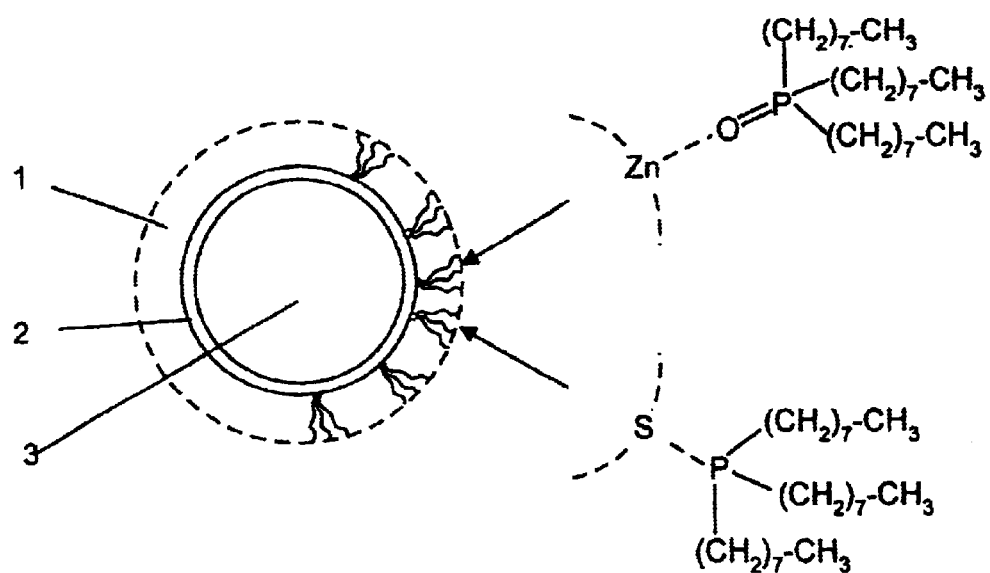
FIG. 1(a) shows the basic structure of conventional cladded nanocrystals, modified at their outer surface with TOPO or TOP.
Figure 1B:
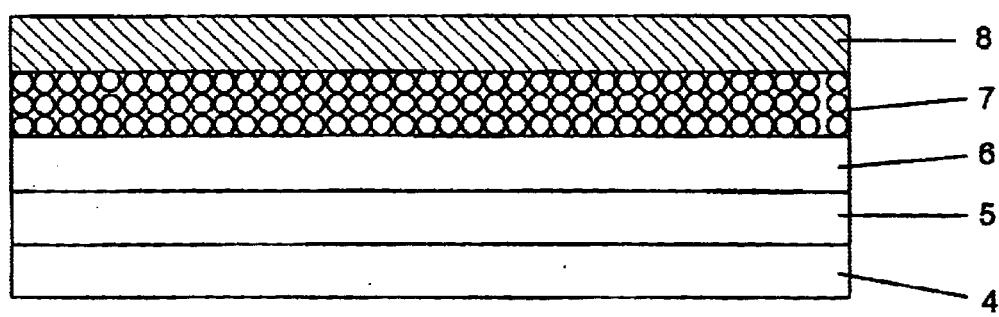
FIG. 1(b) illustrates a conventional thin-film based EL device.
Figure 2A:
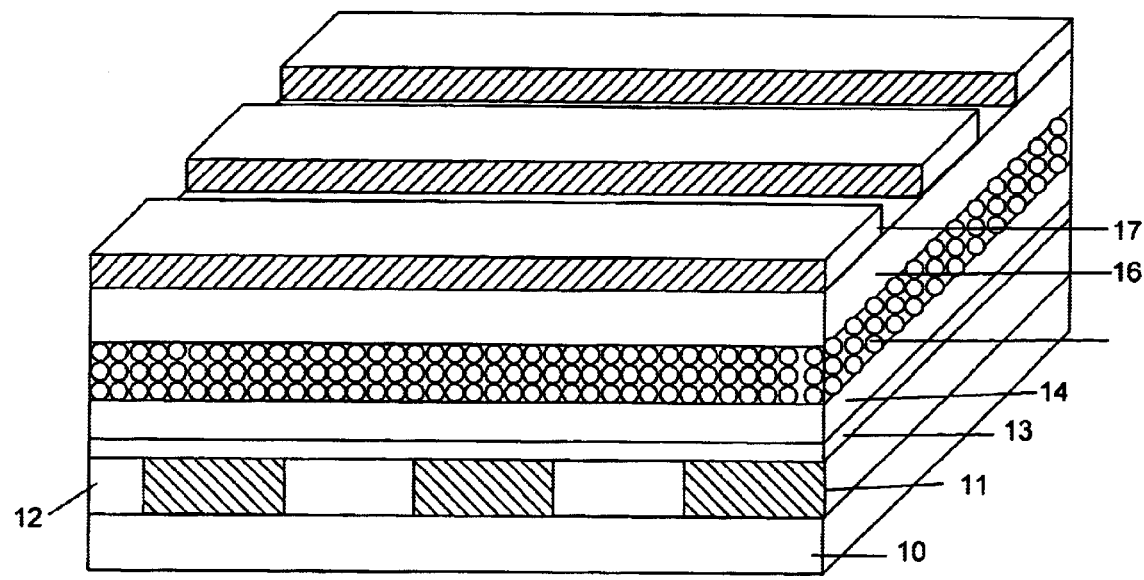
FIG. 2(a) shows an EL device comprising of pseudomorphic cladded quantum dots sandwiched between thin films of wider energy gap semiconductors.
Figure 2B:
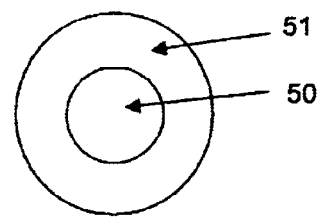
FIG. 2(b) shows a representative pseudomorphic CNC.

FIG. 2 shows an EL device comprising of pseudomorphic cladded quantum dots sandwiched between epitaxially grown thin films of wider energy gap semiconductors. A silicon/silicon oxide composite layer is realized on sapphire substrate 10, consisting of thin doped Si p/p+ regions 11, separated by $SiO_2$ insulating regions 12. The top surface of regions 11 and 12 contain a thin-layer of Si (13) which allows to grow a wider gap semiconductors layer 14, cladded quantum dots 15, and covered with another wider gap semiconductors layer 16. Top contact electrodes 17, running perpendicular to the doped Si regions 11, are formed by metalization. In the case that layer 14 is of p-type semiconductor, layer 15 can be n-type to form to p/n junction that could operate in injection or avalanche mode depending on forward or reverse bias. In the case where layers 11, 13 and 14 are doped n-type, and if layer 16 is thin and lightly n-doped, the metalization layer 17 can form a Schottky barrier. This device can also work in injection or avalanche mode depending on forward or reverse bias. In the case of avalanche operation, the layer forming a reverse barrier junction should be thick enough to produce impact ionization that leads to avalanche multiplication of carriers.

Figure 3:
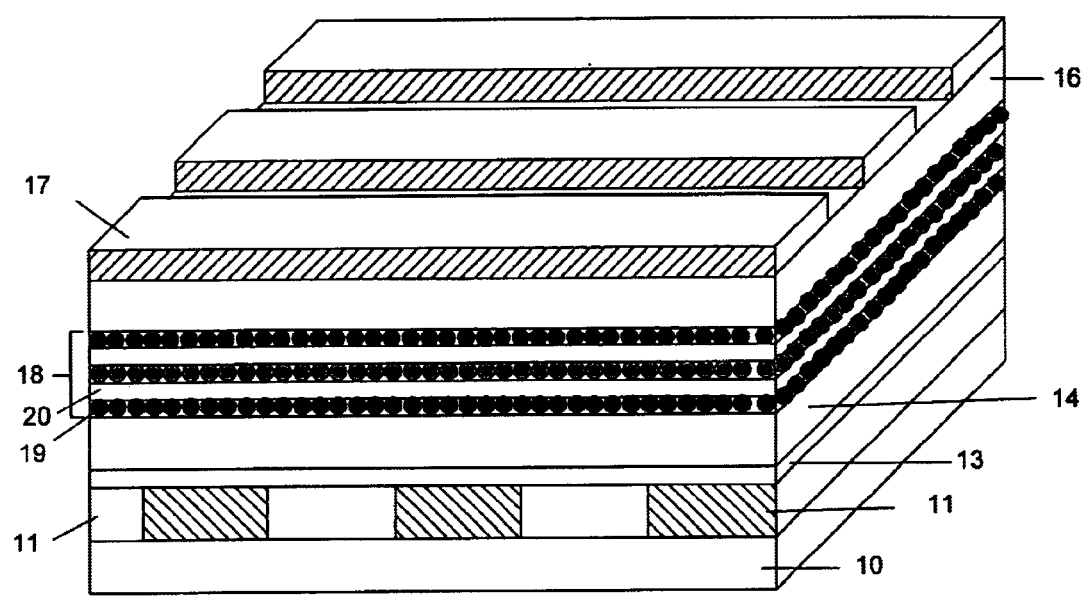
FIG. 3 shows an EL device having multiple layers comprising of pseudomorphic cladded quantum dots sandwiched between epitaxally grown thin films of wider energy gap semiconductors.

FIG. 3 shows a variation of FIG. 2 device having layer 18 consisting of multiple layers of pseudomorphic cladded quantum dots (19), sandwiched between epitaxially grown thin film layers of wider energy gap semiconductors (20). This arrangement forms multiple quantum dot (MQD) structures. Relatively thick MQD structures are suitable for avalanche type EL devices where as few layers of MQD structures are suitable for injection EL.

Figure 4:
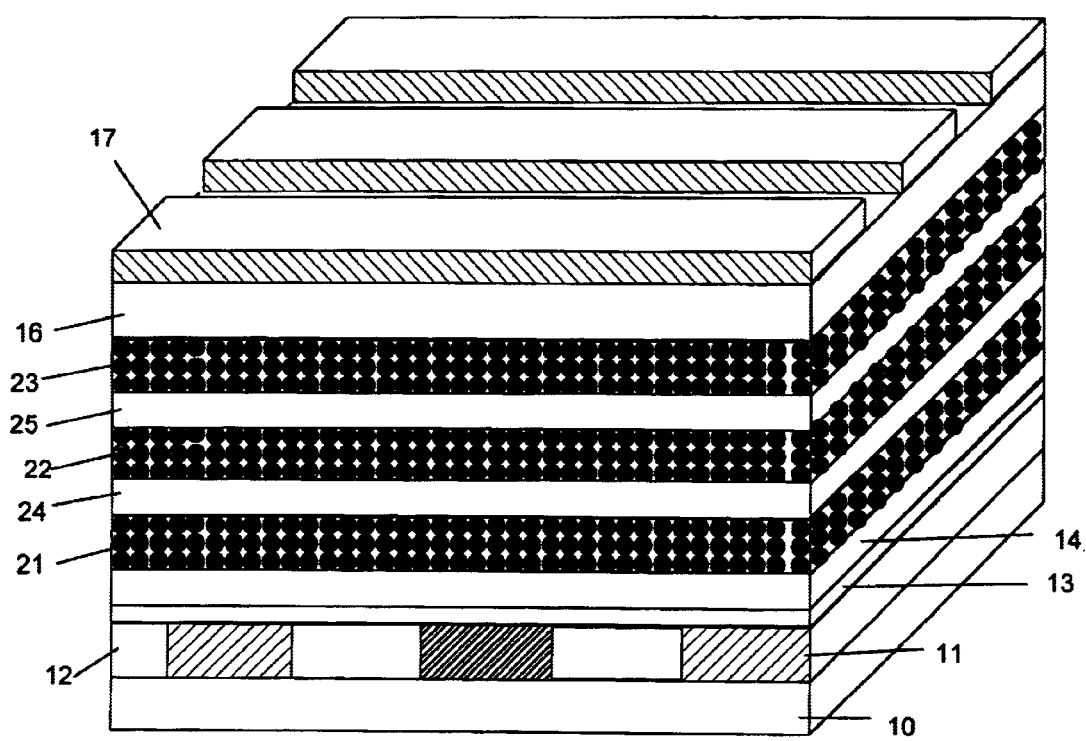
FIG. 4 shows a typical white light EL device vertically integrating three primary colors via layers comprising of different pseudomorphic cladded quantum dots whose core size and composition produces the desired color response.

FIG. 4 shows a variation of FIG. 2 device having the multiple layers comprising of CNCs stacked based on their emission color. For example, depending on the core size and composition, pseudomorphic cladded dots ZnCdSe/ZnSe or ZnCdSe/ZnSSe, emitting red 23, green 22, and blue 21 (RGB) are going to be deposited successively on top of the wider gap semiconductor layer 14, 24 and 25 respectively. If layer 24 and 25 do not include tunnel junctions, this structure would operate in avalanche mode. Insertion of p+/n+ tunnel junctions is required [Ref.10] to run it as an injection device. This structure is geared to produce stable white EL lamps, ensuring that no energy transfer takes place between different color CNCs. These white lamps are expected to retain their chromaticity characteristics during their operating lifecycle.

Ensuring that the spacing between the quantum dots is filled with wider energy gap semiconductor, channeling carriers through the embedded CNCs is expected to be particularly important to lower the driving voltage. These structures are expected to operate at significantly reduced voltages, (in the range from 5–20 V). The enhanced radiative transition rates in pseudomorphic CNCs make them suitable for fast frame rate applications. [Ref.6]

Figure 5:
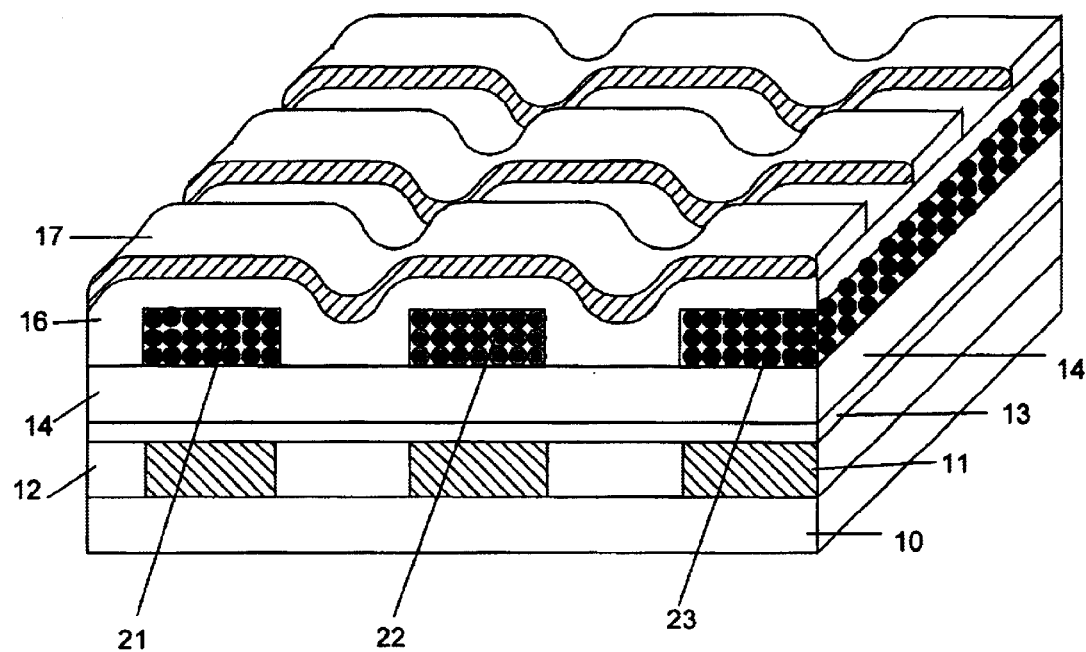
FIG. 5 shows a red, green and blue (RGB) EL display matrix having layers comprising of deferent pseudomorphic cladded quantum dots whose core size and composition produces the desired color response.

FIG. 5 shows a variation of FIG. 2 device structure, where CNCs are stacked based on their emission color to form full color pixelated devices. For example, depending on the core size and composition emitting red 23, green 22, and blue 21 (RGB) are going to be deposited successively to form rows on top of layer 14. This placement of CNC can be accomplished using a variety of deposition techniques. One of these techniques could be the electrostatic deposition of CNCs on the lower bottom electrodes (layer 12) that are appropriately biased.

Figure 6:
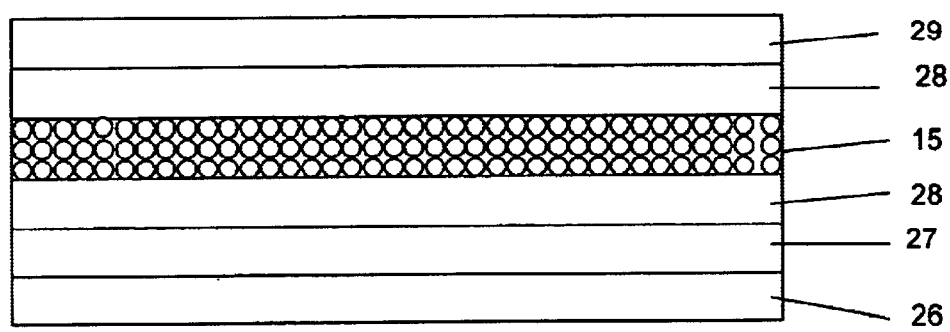
FIG. 6 shows an avalanche, non epitaxial device where quantum dots are sandwiched on dielectric layers such as SiON, $Ta_2O_5$, $Ba_xSr_{1-x}TiO_3$, PLZT, $Zn_xMg_{1-x}S$, $Zn_xBe_{1-x}S$, etc. or their combination. The dielectric layers are grown on ITO, polycrystalline or amorphous silicon with appropriate conductivity, metals, etc.

FIG. 6 shows the cross-sectional schematic of an avalanche, non-epitaxial EL device structure showing only one pixel. ITO layer 27 is grown on substrate 26 forming row of electrodes (only one pixel is shown), followed by a dielectric layer 28. The quantum dots (layer 15) are deposited on the said dielectric layer 28. This is followed by the deposition of another dielectric layer 28, and a metal layer 29 forming columns of electrodes (only one electrode is shown) complete a passively addressed display matrix. The dielectric layers 28 could be of SiON, $Ta_2O_5$, $Ba_xSr_{1-x}TiO_3$, PLZT, $Zn_xMg_{1-x}S$, $Zn_xBe_{1-x}S$, etc. or their combination. The electrode layer 27 could be of ITO, or polycrystalline or amorphous silicon with appropriate conductivity. For actively address displays, the polycrystalline or amorphous Si could host thin film transistors. The top electrode could be comprised of metal of ITO electrodes.

Figure 7:
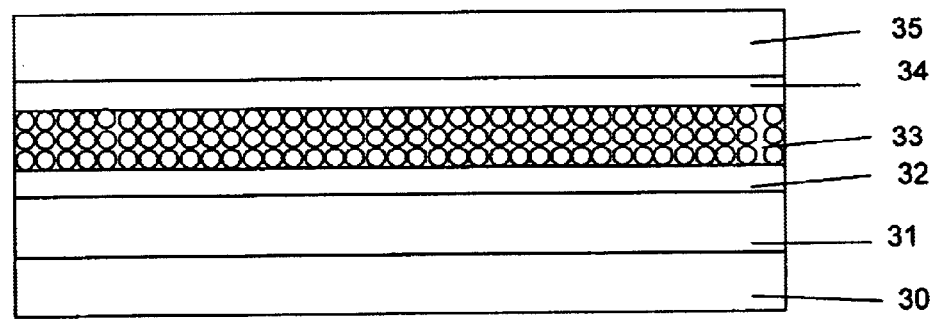
FIG. 7 shows an injection based EL device incorporating nanophosphors utilizing a variety of amorphous or polycrystalline semiconductors or insulators layers.

FIG. 7 shows the cross-sectional schematic of an injection based EL device incorporating nanophosphors utilizing a variety of silicon-layer 31-on-insulator 30 substrates. Layer 31 is used to form pixelated electrodes similar to that of FIG. 2. A thin layer of p-type semiconductor 32 with gap wider than that of CNCs layer 33 is grown to inject holes into the cores of CNCs. A thin hole-blocking layer 34 with a gap wider than CNC semiconductor core is grown on top of these CNCs, followed by a metal electrode 35. Hole blocking can be achieved by thin layers of semiconductors or insulators such as $Ta_2O_5$, $Zn_xMg_{1-x}S$, $Zn_xBe_{1-x}S$, etc. or their combination.

FIG. 8 shows a hybrid (organic/inorganic) injection EL device. The p-type wider energy semiconductor layer 44 comprises of a hole-transporting (undoped) organic layer where its ionization potential is high enough to inject holes to CNCs based on carbazole based derivatives, such as polyvinylcarbazole (PVK) and 4,4"-N,N'-dicarbazole-biphenyl (CBP) which can be spun-coated or vacuum deposited, respectively).

Figure 8A:
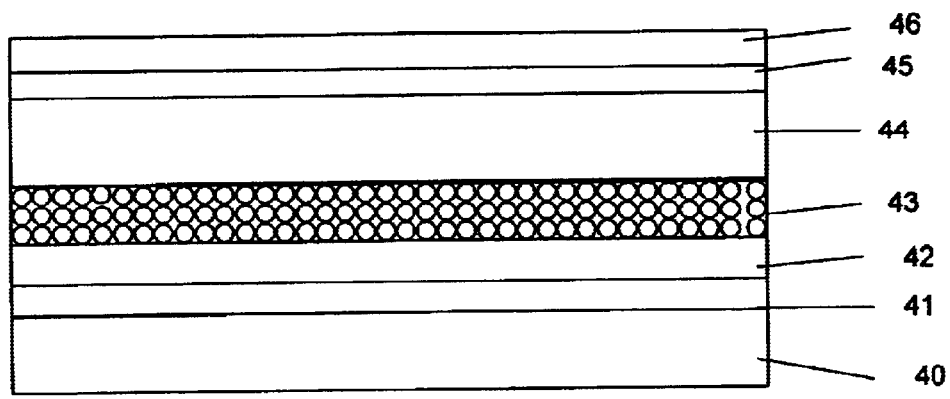
FIG. 8(a) shows an injection based hybrid (organic/inorganic) EL device. The quantum dots are incorporated in between the n-type (inorganic) and hole-transporting (organic) semiconductor layers.

In FIG. 8(a), the CNCs (layer 43) are spun coated on top of n-type wide-energy inorganic semiconductor layer 42 (e.g. $Zn_xMg_{1-x}S$, $Zn_xBe_{1-x}S$) which is grown epitaxially on a thin n+ silicon layer 41 supported on a compatible substrate 40 (e.g. Si, sapphire). A thin layer of the hole-transporting organic semiconductor 44 is then grown on the CNC layer 43, followed by a conductive organic layer 45, which facilitates formation of ohmic contact with the top electrode 46.

Figure 8B:
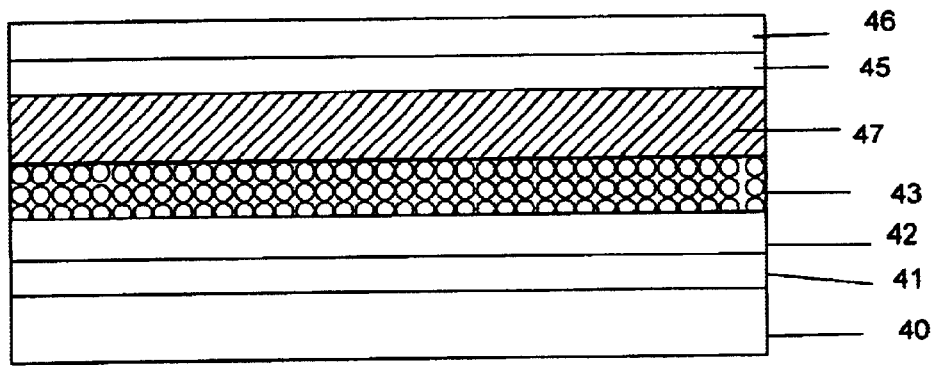
FIG. 8(b) shows a structure similar to FIG. 8(a) where the organic hole-transporting layer is doped with an oxidative agent.

In FIG. 8(b), layer 47 comprises of the hole-transporting organic semiconductor which is lightly doped with an oxidative agent such as ($Fe^{III}$citrate or $Fe^{III}$oxalate). The oxidation agent is selected such as not to dissociate away from its counter ion. For example, the $Fe^{III}$citrate is stabilized by multiple chelation. Building controllable thickness organic shells around the oxidation agent avoids permanent adsorption of oxidizing agent at the surface of CNCs. If this adsorption takes place (e.g. using $FeCl_3$) then the photoluminescence of CNCs is quenched. Therefor a thin shield is constructed around the oxidizing agent or CNC utilizing appropriate counter ions, chelating agents, surfactants and dentrimers. When such a carefully-designed oxidizing agent is introduced in the vicinity of CNCs, it controllably extracts one electron from the CNC, leaving a hole which can recombine with an injected electron to produce a photon.

Figure 8C:
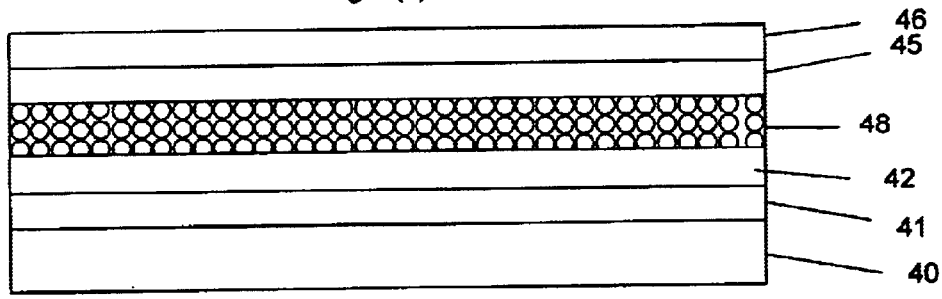
FIG. 8(c) shows an injection based hybrid (organic/inorganic) EL device. The quantum dots are incorporated within the hole-transporting organic semiconductor layer.

In FIG. 8(c), the hole-transporting organic acts as host to forms the matrix for CNCs (layer 48). Such composites can be easily spin coated.

Figure 8D:
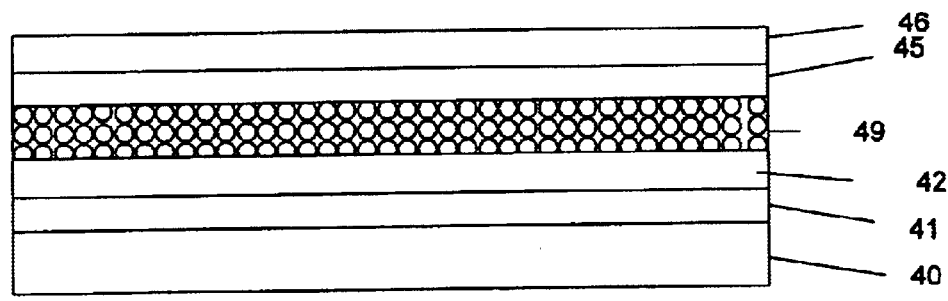
FIG. 8(d) shows a structure similar to FIG. 8(c) where the organic hole-transporting layer is doped with an oxidative agent.

FIG. 8(d) shows a structure similar to FIG. 8(c) where the composite of CNCs and the organic hole-transporting layer is doped with oxidative agent(s) discussed above, forming layer 49.

Figure 9:
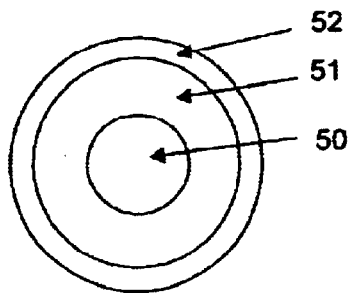
FIG. 9 shows a representative pseudomorphic CNC with an optional outer environmental passivation layer.

The profound permeability of organic compounds to moisture and oxygen requires the grown of a protective outer passivation layer on the CNCs. This is shown in FIG. 9, where the CNC, comprising of the core (50) and the pseudomorphic cladding (51), is coated with a passivation layer 52, (e.g. ZnO, $SiO_x$, SiON, $Ta_2O_5$, etc.).

Figure 10A:
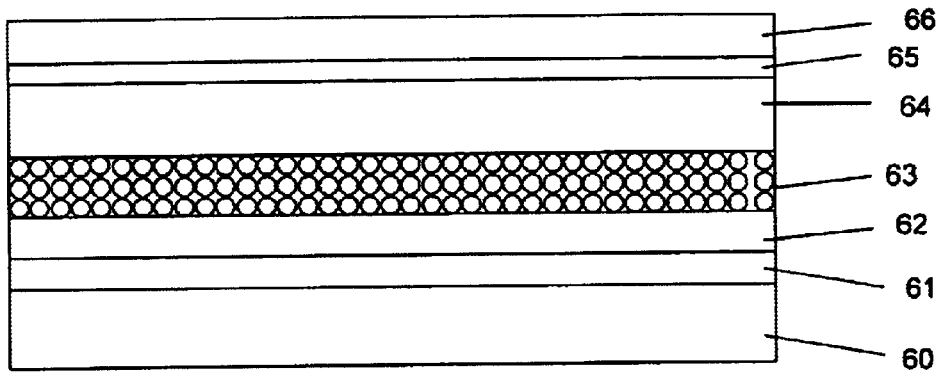
FIG. 10(a) shows an all-organic injection based EL device. The CNCs are incorporated within the p-type organic semiconductor layer.

FIG. 10(a) shows an all-organic CNC-based injection EL device. A substrate (60) supports an ITO layer 61. With the help of an organic conductive layer 62, holes are easily introduced to a composite layer 63, comprised of CNCs and an organic hole-transporting agent. Subsequently, an electron transporting organic layer 64 is deposited. This is followed deposition of a thin (8–20 Å) tunneling layer 65, which is contacted with a top electrode (66). The organic conductive layer 62 may be realized by polyaniline or polythiophene based conductive polymers. The electron transporting layer 64 may be realized by bathocuproin, BCP, (a material with a 3.5 eV band gap, capable of injecting electrons in CNCs and blocking hole transport to the cathode). The electron-transporting layer could be combination of two layers having two different energy gaps such as CBP and aluminum (III) quinoline ($Alq_3$). The thin tunneling layer 65, may be composed from materials such as CsF, LiF, $Al_2O_3$, etc. The top electrode 66, may be realized by metals (e.g. Al) or a thin-transparent metal layer covered with ITO.

Figure 10B:
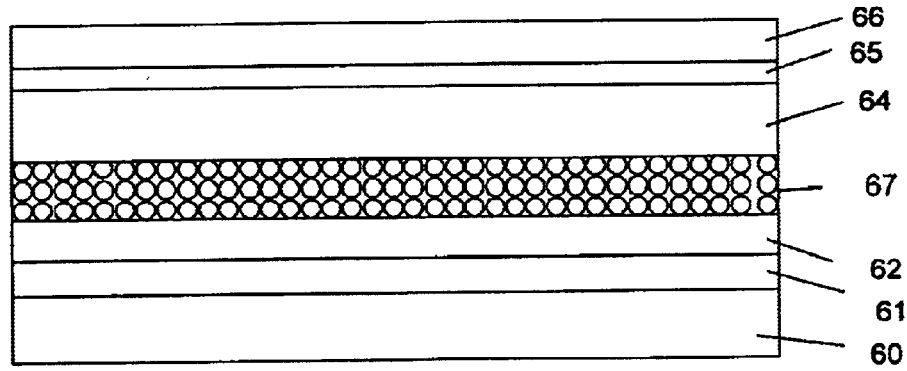
FIG. 10(b) shows a structure similar to FIG. 10(a) where the organic p-transport medium is doped with an oxidative agent.

FIG. 10(b) shows a structure similar to FIG. 10(a). Here, the layer 67, consisting of CNC and organic hole-transporting agent is doped with oxidative agent(s) described above.

Figure 10C:
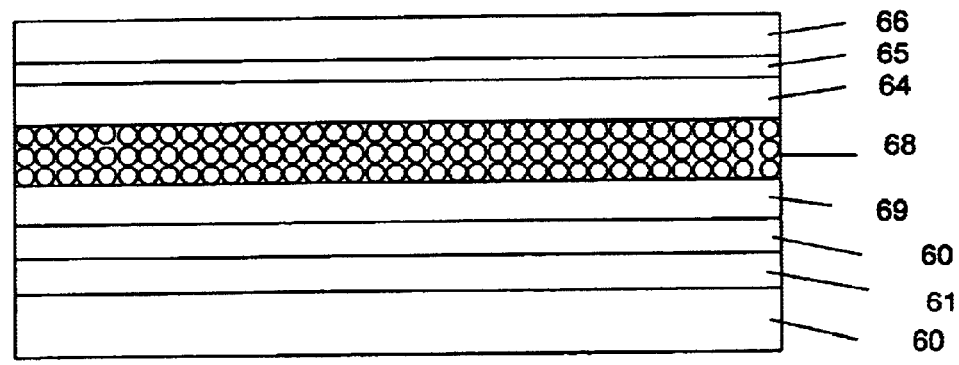
FIG. 10(c) CNCs are sandwiched between the hole- and electron-transporting organic semiconductor layer.

FIG. 10(c) shows a structure similar to FIG. 10(a) where the CNC layer 68, is sandwiched between the hole-transporting layer 69 and electron transporting layer 64.

Figure 10D:
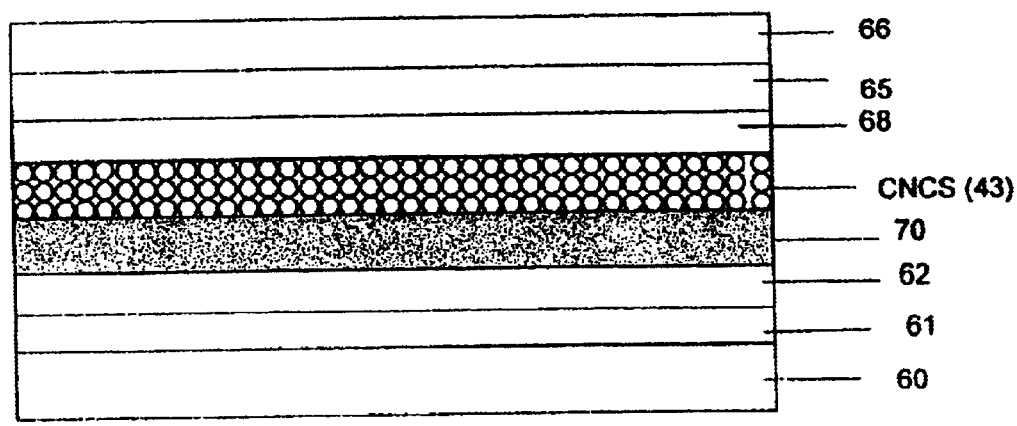
FIG. 10(d) shows a structure similar to FIG. 10(c) where the hole-transporting layer is doped with an oxidative agent.

FIG. 10(d) shows a structure similar to FIG. 10(c), where the hole-transporting layer 70, is doped with an oxidative agent.

Figure 11A:
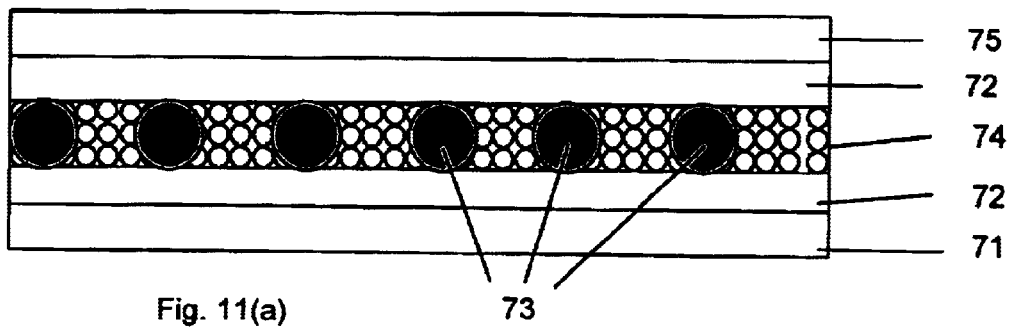
FIG. 11 (a) shows an EL structure where a viscous, mellifluous composite (consisting of CNCs, p-type organic semiconductors, oxidative agents and viscosity modifying agents having low vapor pressure), is sandwiched between two electrodes.
FIG. 11(b) shows a display based on EL structure of FIG. 11(a) employing a passive-matrix-addressing scheme. Here, rows and columns of the bottom and top electrodes respectively are separated by an elastomeric spacer that form vesicles where the viscous composite can be inject printed with and RGB pattern.

FIG. 11(a) shows an EL structure where a viscous, mellifluous composite layer 74, is sandwiched between two electrodes (72) supported on their respective substrate (71). The thickness of layer 74 is determined by the spacers (73). The viscous composite may consists of CNCs, hole-transporting organic semiconductors, oxidative agents, soluble salts (e.g. lithium triflate, lithium acetate, etc.) and low vapor pressure viscosity-modifying agents (e.g. dioctyl phthalate, low molecular weight polyethylene oxide, etc.). The spacers (73) may comprise of monodispersed glass microspheres.

Figure 11B:
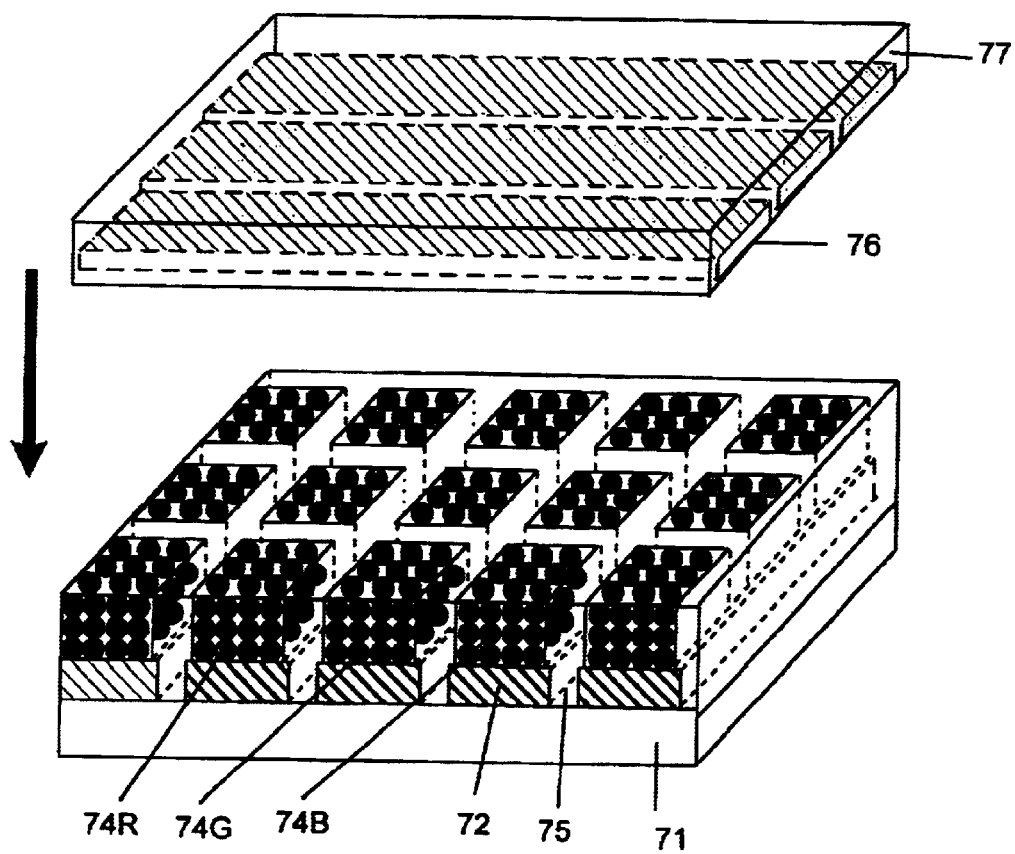

FIG. 11(b) shows an EL structure similar to that on FIG. 11(a). Here the 3-dimensional view of a display employing passively-matrix-address scheme is illustrated. Rows and columns of the bottom and top electrodes respectively are separated by an elastomeric spacer 75 (e.g. polyurethane, polysiloxane elastomer).

With a help of a microlithographically defined 3-D mold, monomeric or oligomeric precursors are squeezed and polymerized in place between the bottom substrate and the mold. Subsequently, the mold is removed and the viscous composite (74) comprising of CNCs, hole-transporting organic semiconductors, oxidative agents, soluble salts and low vapor pressure viscosity-modifying agents is either screen-printed or ink jet printed to fill the cavities within the elastomeric spacer (75). Red, green and blue RGB CNCs are used to define the three colors in the viscous composite (74R, 74G, 74B) to realize full color pixelated displays. The final step seals the structure by placing the cover (top substrate (77) and contacts (76)). Such structures are expected to be mass-produced adapting techniques known in the prior art.

Figure 12:
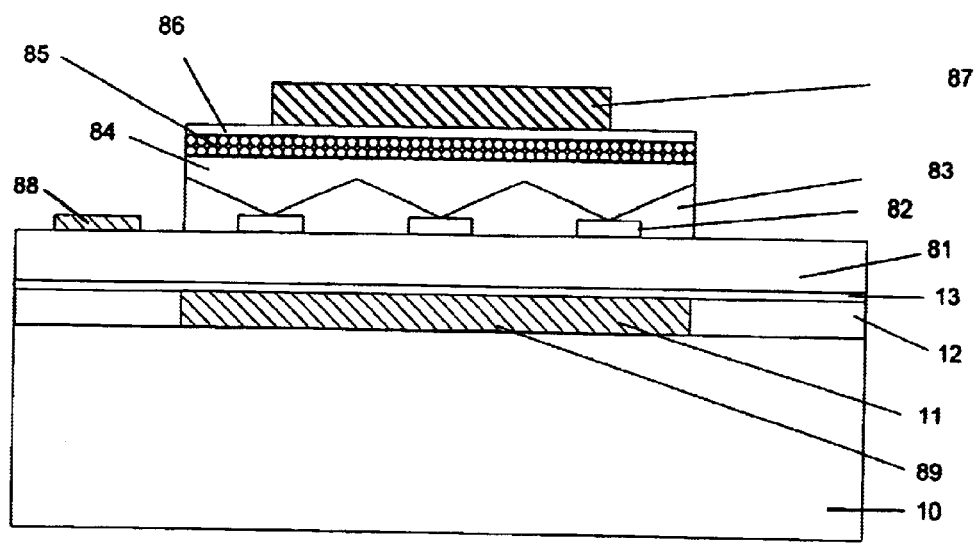
FIG. 12 shows an EL structure employing nanotip Si emitters (realized in the p-Si base layer using the selective area epitaxy through a thin (~10 nm) $SiO_2$ patterned mask having around 0.1 micron spacing between oxide regions) providing minority carriers into the nanophosphor layer. The Si base layer and the nanophosphor layer is reversed biased, channeling electrons and hole in the cores of quantum dots, and subsequently emitting the desired radiation.

FIG. 12 shows an EL structure employing nanotip Si emitters (realized in the base region using the selective area epitaxy through thin $SiO_2$ masks) providing minority carriers into the nanophosphor layer (85). The p-Si base layer (81 and 83) and nanophosphor layer along with n-type wide energy gap outer layer (86) forming the p-n junction are reversed biased. Collected electrons [which are injected from the n-layer (81) underneath the pSi layer 81] are introduced in the cores of nanocrystals where they recombine with holes (supplied by the top contact electrode (87). A typical fabrication methodology to realize this structure is described below.

A silicon/silicon oxide composite layer is realized on sapphire substrate 10, consisting of thin doped Si n/n+ regions 11, separated by $SiO_2$ insulating regions 12 (the spacing between the oxide regions forms a pixel which may be between 10–50 micron in extension). The top surface of regions 11 and 12 contain a thin-layer of Si (13), which allows the growth of a p-Si layer 81. A thin (about 10 nm) patterned $SiO_2$ layer 82 is deposited, which in turn is used to deposit p-Si layer 83 consisting of nanotips (e.g. using selective area epitaxy through 0.1 micron wide pattern [Ref. 11]). This is followed by the deposition of a wide energy gap layer 84 (e.g. ZnMgS etc), followed by deposition of a layer comprising of cladded quantum dots 85, and covered with another wider gap semiconductors layer 86. Top contact electrodes 87, running perpendicular to the doped Si regions 11 (contact shown as 89), are formed by metalization. The p-type semiconductor layer 81 is ohmically contacted via electrodes 88. Here, one can forward bias the n-p junction formed by layers 13 and 81, and reverse bias the junction formed by the p-Si nanotips 82 and n-type layer 84. The collected electrons from the nanotip layer are accelerated in layers 84, 85, and 86. They form electron-hole pairs, which in turn migrate to the cores of the cladded pseudomorphic quantum dots. Thus contacts 88 and 87 are reversed biased and contact 89 and 88 are forward biased.

This device structure permits active addressing via the biasing of contacts 89 and 88, or the emitter and base junction, viewing the device as an n-p-n structure. In a modified version, one can envision eliminating the emitter-base junction (formed between layers 13 and 81), and having nanoemitters directly providing carriers into phosphor via a reverse biased junction. The nanoemitters could be in the form of ridges or pyramids. There pointed tips that create higher values of electric field for a given reverse bias, result in the acceleration of collected carriers in the wider gap layer and the nanophosphor layer. This would result in introduction of carriers at much lower voltages than is anticipated in conventional field emission devices (FEDs).

While the preferred embodiments of the invention have been described, it will be apparent to those skilled in the art that various modifications may be made in the embodiments without departing from the spirit of the present invention. Such modifications including lattice-matched or pseudomorphic cladded quantum dots, quantum dots with coupled cores are all within the scope of this invention. We have described p–n structures sandwiching quantum dot layer(s) for injection or avalanche type EL displays, Schottky barrier contacts can also be used. Wider energy gap semiconductor layers, dielectric layers, as well as quantum dots -can be selected and patterned (in order to facilitate various addressing schemes, such as passive and active matrix) from a wide ranging material list. In addition, electrodes can be isolated via oxide regions (as shown in figures), reverse biased junctions, and other standard methods.

Although we have described EL devices, the structure is adaptable to cathodoluminiscence devices which are addressed by electron beam replacing the regular phosphor by quantum dot based nanophosphor. Various organic structures showing hole transport and electron transport layers can also be realized with variations in materials selected. We have not shown active matrix addressing. In Si on Insulator substrates, one can implement transistors in the top Si layer. Other logic devices can be integrated if needed.

What is claimed is:

1. A p-n-p configuration electroluminescent (EL) device, comprising successively layers of:

a p-type silicon layer on an insulator substrate, comprising thin doped Si p/p+ regions separated by insulating regions wherein said p+ regions are contacted to form bottom electrodes;

a thin-layer of Si which allows further epitaxial growth;

a p+-type Si layer, having addressing contact electrodes;

a thin (about 10 nm) $SiO_2$ layer deposited and patterned with a pitch of about 0.1 microns;

a n-Si layer forming nanotips;

an n-type wide energy gap layer selected from the group of semiconductors consisting of $Zn_aMg_{1-a}Se$, $Zn_aMg_{1-a}S$, $Zn_aMg_{1-a}S_bS_{1-b}$, $Zn_aBe_{1-a}S_bS_{1-b}$, $Al_cGa_{1-c}N$, ZnMgBeSe, and AlInN, stacked on layer with nanotips;

a layer comprising cladded quantum dots;

a p-type wide energy gap semiconductor layer selected from the group of semiconductors consisting of: $Zn_aMg_{1-a}Se$, $Zn_aMg_{1-a}S$, $Zn_aMg_{1-a}S_bS_{1-b}$, $Zn_aBe_{1-a}S_bS_{1-b}$, $Al_cGa_{1-c}N$, ZnMgBeSe, and AlInN; and a layer forming contact electrodes, wherein said set of electrodes being appropriately biased and addressed to create a two-dimensional display.

* * * * *